United States Patent
Suguno (10) Patent No.: US 10,304,973 B2
(45) Date of Patent: May 28, 2019

(54) INFRARED SENSOR

(71) Applicant: Mitsubishi Electric Corporation, Tokyo (JP)

(72) Inventor: Takaki Suguno, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 191 days.

(21) Appl. No.: 15/255,309

(22) Filed: Sep. 2, 2016

(65) Prior Publication Data

US 2017/0330978 A1    Nov. 16, 2017

(30) Foreign Application Priority Data

May 12, 2016    (JP) ................................ 2016-095796

(51) Int. Cl.
| | | |
|---|---|---|
| H01L 31/0203 | (2014.01) | |
| H01L 27/146 | (2006.01) | |
| H01L 31/09 | (2006.01) | |

(52) U.S. Cl.
CPC .... *H01L 31/0203* (2013.01); *H01L 27/14649* (2013.01); *H01L 27/14669* (2013.01); *H01L 31/09* (2013.01)

(58) Field of Classification Search
CPC ......... H01L 27/14669; H01L 27/14649; H01L 31/09; H01L 31/0203
See application file for complete search history.

(56) References Cited

U.S. PATENT DOCUMENTS

| | | | | |
|---|---|---|---|---|
| 5,747,863 A | * | 5/1998 | Shoda ............... | H01L 27/14609 250/332 |
| 2003/0178565 A1 | * | 9/2003 | Shigenaka .......... | H01L 27/1463 250/332 |
| 2009/0121137 A1 | * | 5/2009 | Liddiard ............... | G01J 5/20 250/338.1 |

FOREIGN PATENT DOCUMENTS

| | | |
|---|---|---|
| JP | 2003-294523 A | 10/2003 |
| JP | 2006-220555 A | 8/2006 |
| JP | 2010-151736 A | 7/2010 |
| JP | 2010-217012 A | 9/2010 |
| JP | 2011-123023 A | 6/2011 |

OTHER PUBLICATIONS

Communication dated Mar. 7, 2017 from the Japanese Patent Office in counterpart Japanese application No. 2016-095796.

* cited by examiner

*Primary Examiner* — Ermias T Woldegeorgis
(74) *Attorney, Agent, or Firm* — Sughrue Mion, PLLC; Richard C. Turner (57) ABSTRACT

An infrared sensor forming an infrared solid-state imaging device includes a sensor element portion disposed in a package. In the sensor element portion, an absorption structure supported on a substrate is provided. The absorption structure has a structure in which a second insulating film, an absorption film, and a first insulating film are stacked on a reflective film. The first insulating film and the second insulating film are formed so as to have a film thickness with which the index of absorption of infrared radiation entering the absorption structure is maximized with consideration given to the energy loss in an optical transmission path to the absorption structure.

5 Claims, 6 Drawing Sheets

INFRARED SENSOR

BACKGROUND OF THE INVENTION

1. Field of the Invention

The present invention relates to an infrared sensor that is used in a non-cooling infrared solid-state imaging device.

2. Description of the Related Art

In an infrared sensor forming an infrared solid-state imaging device, the detection wavelength range thereof is broadly divided into a near-infrared band of 0.8 to 3.0 µm, a mid-infrared band of 3.0 to 6.0 µm, and a far-infrared band of 8.0 to 100.0 µm. In addition, various infrared sensing technologies and applications to which the technologies are applied have been proposed.

In the detection wavelength range, in a far infrared region, in particular, in a wavelength range of 8 to 14 µm, the infrared sensor captures infrared radiation as thermal energy produced by molecular resonant motion and converts the thermal energy into an electrical signal. It is for this reason that the infrared radiation in this wavelength range is called thermal infrared radiation. A sensing element that detects the thermal infrared radiation is called a non-cooling infrared sensor.

Here, according to Planck's radiation law, the energy radiated from a temperature object at 300 K has a radiation energy peak near 10 µm. In addition, the body temperature of a human body is about 300 K. Based on these facts, various application systems to which the technology for detecting a human by far infrared radiation is applied have been proposed. These applications include, for example, the human detecting technology for vehicles and the security management technology for buildings.

The above-described non-cooling infrared sensor makes the infrared radiation radiated from a subject (for example, a human body) resonate and vibrate with the molecules of an absorption film absorbing the infrared radiation and converts the kinetic energy thereof into heat.

By performing thermoelectric conversion in a bolometer using a material typified by VOx (vanadium oxide) by using this heat, the non-cooling infrared sensor senses the infrared radiation by reading the infrared radiation as a change in the electrical signal.

The bolometer is a device that measures the radiation energy such as infrared radiation by using a material whose resistance changes with an increase in temperature.

Since thermoelectric conversion technology is applied to the infrared sensor forming the non-cooling infrared solid-state imaging device that detects thermal infrared radiation in the above-described manner, the above infrared sensor does not include, as a component element, a refrigeration mechanism which is used in a quantum-type infrared sensor that detects a mid-infrared region, this infrared sensor has an advantage in size and cost reduction of the entire system.

Therefore, as for an infrared sensor that detects far infrared radiation, various detection methods and pixel structures are proposed, and it is expected that these detection methods and pixel structures will be applied to the above-described applications.

Next, JP-A-2003-294523, JP-A-2006-220555, and JP-A-2011-123023 describing the existing technologies will be described.

In an infrared detector described in JP-A-2003-294523, a structure in which two or more layers of infrared absorption portions are provided parallel to each other is disclosed, and the technology for performing infrared absorption in a wider band by controlling a hollow between the infrared absorption portions is proposed (see, for example, JP-A-2003-294523).

In an infrared detecting element described in JP-A-2006-220555, a structure that increases the absorption efficiency by making a reflective film provided immediately below an infrared absorption portion reflect the infrared radiation that has passed through the infrared absorption portion and returning the infrared radiation to the absorption portion again is disclosed (see, for example, JP-A-2006-220555).

Moreover, in an optical sensor of JP-A-2011-123023, the technology that uses infrared absorption using interfering light like the above-described absorption structure and absorption by natural vibration excitation of a material is disclosed. In accordance with this optical sensor, the technology for discerning between, for example, a human body and gas by discriminating the wavelength of infrared radiation radiated from a subject from others by obtaining the difference between signals generated by the above-described absorption at the time of output is proposed (see, for example, JP-A-2011-123023).

The sensor structures described in JP-A-2003-294523 and JP-A-2006-220555 are the structures proposed based on the premise that ideal infrared radiation having the energy radiated from the subject enters the sensor with no consideration given to attenuation in the infrared radiation which is caused to enter the infrared absorption portion, the attenuation due to energy absorption in system structural members. The ideal infrared radiation here refers to infrared radiation which is not affected by absorption and reflection in an optical system and a window member and has spectral energy based on the law of blackbody radiation.

That is, the infrared radiation radiated from the subject changes before reaching the absorption portion of the infrared sensor incorporated into the non-cooling infrared solid-state imaging device since the infrared radiation passes through structural members of the infrared solid-state imaging device. The structural members of the infrared solid-state imaging device are, for example, a window member provided in a housing, an optical lens disposed in the housing, a window member of a package of the infrared sensor, and so forth. In addition, when the device is installed outdoors, the housing is further protected by another housing for making the housing waterproof.

As a result of this structure, in view of the system configuration of the existing infrared solid-state imaging device, the energy radiated from the subject suffers spectral absorption loss caused by many structural members due to intrinsic physical properties of the materials thereof before reaching the absorption portion of the infrared sensor. As a result, infrared spectral energy which is different from the energy radiated from the subject enters the absorption portion.

Thus, it is difficult to say that, although the existing infrared sensor can improve the absorption efficiency of the ideal infrared radiation, the existing infrared sensor has the optimum structure with consideration given to the spectral absorption loss caused by the system structural members.

Moreover, the infrared sensor disclosed by JP-A-2011-123023 has a structure provided with infrared absorption using interfering light and infrared absorption by material natural frequency excitation. However, as is the case with the above-described infrared sensors, absorption film design with consideration given to the spectral absorption loss in the system structural members of the infrared solid-state imaging device is not performed also in this case, and it is difficult to say that the sensitivity of the entire infrared solid-state imaging device is optimized.

Incidentally, it may be possible to reduce the absorption loss by selecting and using a germanium material or the like as the system structural members, but this is not suitable for the optimization (best effort) of performance and cost reduction in system design. In other words, using germanium which is unfavorable in terms of cost results in inadequate exploitation of the advantage of the non-cooling infrared sensor which is considered to have an advantage in cost reduction.

SUMMARY OF THE INVENTION

This invention has been made to solve the above-described problem, and an object thereof is to provide an infrared sensor that can optimize sensitivity while curbing costs.

An infrared sensor according to this invention includes: a package; and an absorption structure that is disposed in the package, includes an absorption film absorbing infrared radiation that has passed through a window member of the package, a first insulating film stacked on an upper surface of the absorption film, a second insulating film stacked on a lower surface of the absorption film, and a reflective film stacked on a lower surface of the second insulating film, and is supported on a substrate, and the first insulating film and the second insulating film are formed so as to have a film thickness with which the index of absorption of the infrared radiation entering the absorption structure is maximized.

With the infrared sensor of this invention, by controlling the film thickness of the first insulating film and the second insulating film in accordance with the characteristics of the infrared radiation entering the absorption structure, it is possible to obtain an infrared sensor with optimum sensitivity from which the influence of the energy loss in a transmission path of the infrared radiation is eliminated.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

First Embodiment

An infrared sensor of a first embodiment of the present invention will be described by using FIGS. 1 to 8.

Figure 1:
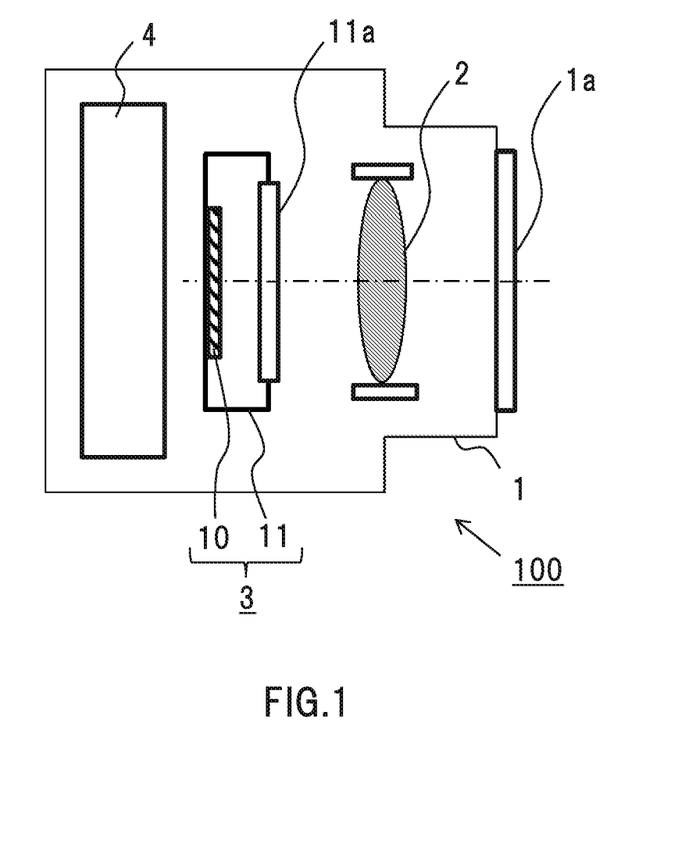
FIG. 1 is a sectional view of an infrared solid-state imaging device into which an infrared sensor of a first embodiment of the present invention is incorporated.

FIG. 1 is a schematic sectional view of an infrared solid-state imaging device 100 provided with an infrared sensor 3 according to the present invention.

First, by using FIG. 1, a path over which the infrared radiation radiated from a subject travels before the infrared radiation enters an absorber of the infrared sensor 3 in the infrared solid-state imaging device 100 will be described.

In the infrared solid-state imaging device 100, the infrared radiation radiated from the subject passes through a window member 1a of a housing 1 is focused and made to form an image by a lens 2, and reaches the infrared sensor 3. The window member 1a is a window member provided for cutting off the internal space from the outside space in the case of outdoor installation or installation on vehicles. Lens 2 is an optical lens.

The infrared sensor 3 is formed mainly of a sensor element portion 10 that absorbs infrared radiation and a package 11 in which the sensor element portion 10 is mounted. Then, the infrared radiation that has passed through a window member 11a of the package 11 of the infrared sensor 3 enters an absorption portion 21 (which will be described later) of the sensor element portion 10 and is absorbed thereby.

Incidentally, the information of the infrared radiation absorbed in the sensor element portion 10 is subjected to analysis processing in an analysis portion 4 disposed in the housing 1, for example.

Here, since the feature of the present invention lies in the structure of the sensor element portion 10 of the infrared sensor 3, in particular, film thickness control of constitutional films of an absorption structure 22 (which will be described later) of the sensor element portion 10, this absorption structure 22 will be described in detail and explanations of other component elements such as a signal readout portion will be omitted.

When an image is taken by the infrared solid-state imaging device 100, the infrared radiation radiated from the subject propagates through the atmosphere and reaches the window member 1a of the infrared solid-state imaging device 100. The wavelength of the infrared radiation radiated from the subject is, if the subject is a human, 10 μm as a wavelength near a body temperature (300 K).

Figure 2:
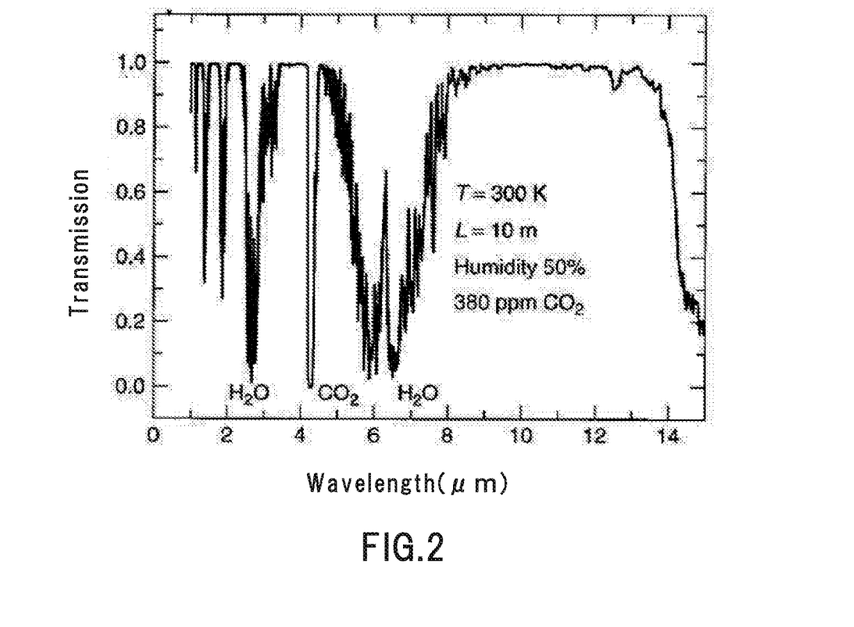
FIG. 2 is a diagram of the infrared spectral transmission characteristics of the atmosphere.

As is clear from the infrared spectral transmission characteristics of the atmosphere depicted in FIG. 2, the infrared radiation of a wavelength of 10 μm tends to have high transmission in the atmosphere. Therefore, it is presumed that the infrared radiation radiated from the subject passes through the atmosphere with little spectral absorption loss and reaches the window member 1a.

Here, as the materials forming the window members 1a and 11a and the lens 2, materials that allow the infrared radiation to pass therethrough and also can ensure physical strength are used. Thus, germanium, silicon, and so forth are candidates for materials to be used.

Figure 3:
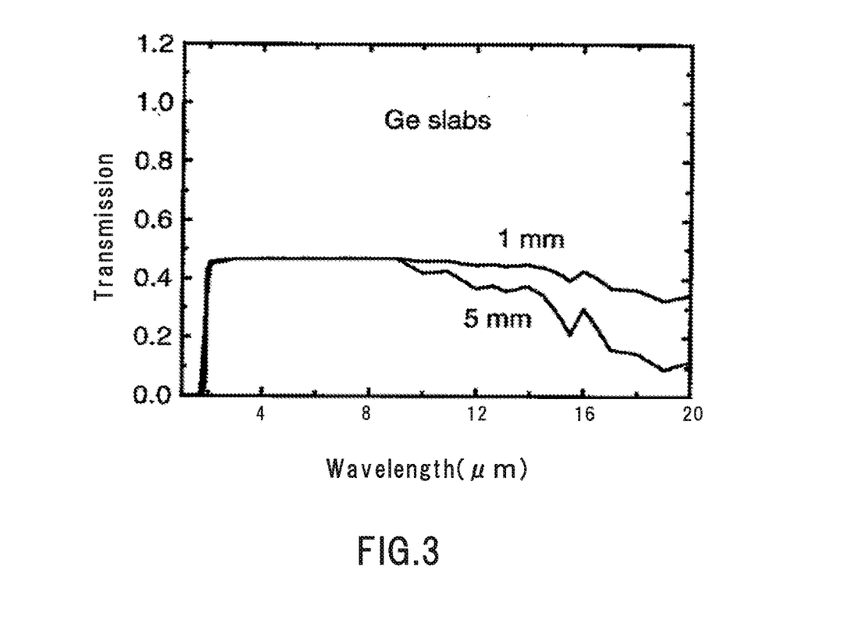
FIG. 3 is a diagram of the infrared spectral transmission characteristics of a germanium material.
Figure 4:
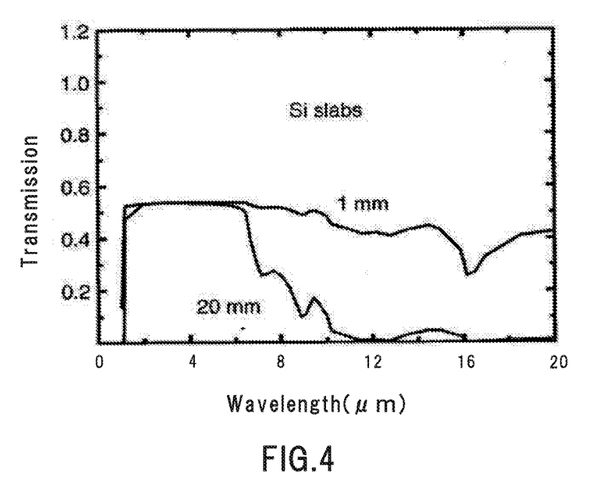
FIG. 4 is a diagram of the infrared spectral transmission characteristics of a silicon material.

As is clear from the infrared spectral transmission characteristics of a germanium material depicted in FIG. 3 and the infrared spectral transmission characteristics of a silicon material depicted in FIG. 4, germanium and silicon have the spectral transmission characteristics depending on the wavelength of incident infrared radiation. If the window members 1a and 11a and the lens 2 are formed by using these materials, energy absorption occurs in the portion where the germanium material or the silicon material is used, and the infrared radiation that has reached the infrared sensor 3 enters the infrared sensor 3 as energy obtained as a result of multiplication by the spectral transmission ratio of each transmission material.

Incidentally, as depicted in FIG. 3, the infrared spectral transmission characteristics of germanium are very good compared to the infrared spectral transmission characteristics of silicon, but the material cost of germanium is higher than the material cost of silicon. Therefore, in the present invention adopting the non-cooling infrared solid-state imaging device 100 having an advantage in size reduction and low price compared to the quantum-type infrared sensor in which transmission structural members are formed by using the germanium material, it can be said that the structure using the germanium material is unfavorable.

Figure 5:
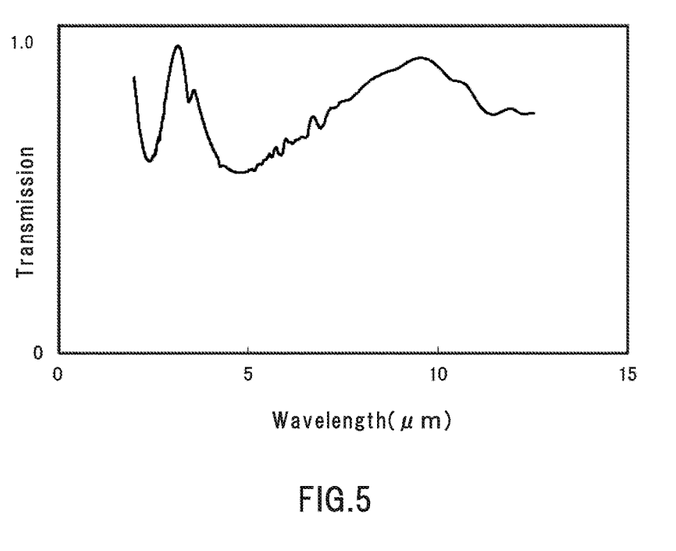
FIG. 5 is a diagram of the infrared spectral transmission characteristics observed when FZ silicon is coated with a DLC film.

The following is a continuation of the verification. FIG. 5 is a diagram of the infrared spectral transmission characteristics observed when a floating zone (FZ) silicon wafer is coated with a diamond-like carbon (DLC) film. In transmission structural members used here, FZ silicon has a board thickness of 0.5 mm and the DLC film deposited as an antireflective film is controlled so as to have a film thickness that can ensure the wavelength transmission characteristics in a 10-μm band. As is clear from FIG. 5, flat transmission characteristics are not observed over the wavelengths; a wavelength loss due to material absorption and material surface reflection is produced and the transmission changes depending on the wavelength.

Figure 6:
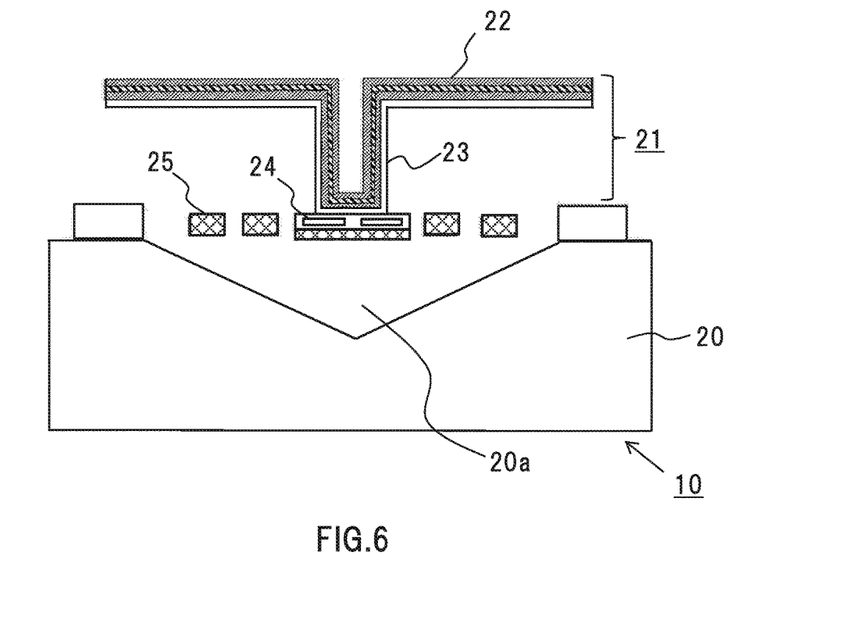
FIG. 6 is a sectional view of a sensor element portion of the infrared sensor of the first embodiment of the present invention.

Next, by using FIG. 6, the structure of the sensor element portion 10 of the infrared sensor 3 according to the present invention will be described. FIG. 6 is a sectional view of the sensor element portion 10 of the infrared sensor 3 of the first embodiment of the present invention. The sensor element portion 10 is disposed in the package 11 and absorbs, in the absorption portion 21, the infrared radiation that has passed through the window member 11a of the package 11. The absorption portion 21 is formed and disposed on a hollow portion 20a of a substrate 20 (a supporting substrate), and the substrate 20 is assumed to be formed of single-crystal silicon, silicon on insulator (SOI), or the like.

The absorption portion 21 is formed mainly of the flat-shaped absorption structure 22 that receives and absorbs the infrared radiation and a supporting column portion 23 that supports the absorption structure 22. The absorption structure 22 having the shape of a flat plate is formed and disposed in such a way as to be parallel to an upper surface (a flat surface) of the substrate 20.

A change in temperature which is caused when the infrared radiation is absorbed in the absorption portion 21 is detected by a temperature sensor portion 24 disposed immediately below the absorption portion 21. In the example of FIG. 6, the temperature sensor portion 24 is provided below the supporting column portion 23 of the absorption portion 21.

The components such as the temperature sensor portion 24 are supported by a supporting leg portion 25 provided on the hollow portion 20a.

Figure 7:
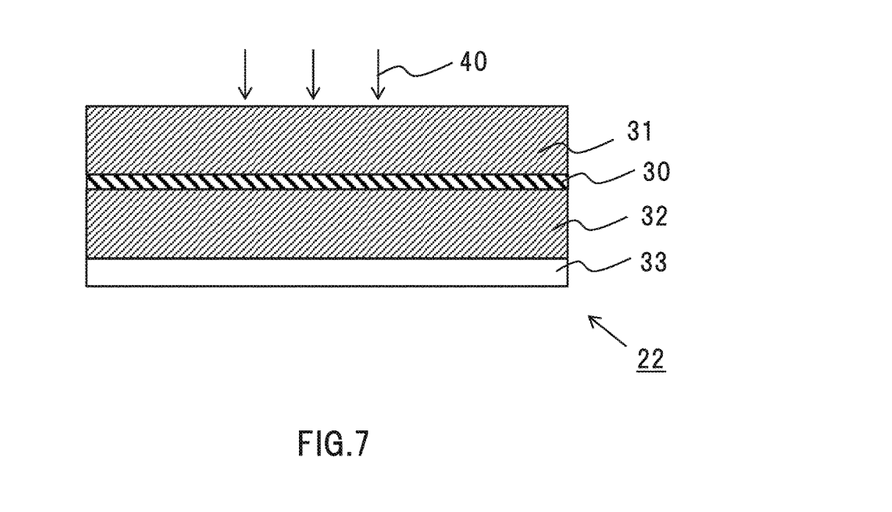
FIG. 7 is a sectional view of an absorption structure forming the infrared sensor of the first embodiment of the present invention.

Next, the absorption structure 22 forming the sensor element portion 10, which is the feature of the present invention, will be described in detail by using an enlarged sectional view thereof depicted in FIG. 7. The absorption structure 22 is formed mainly of an absorption film 30 that absorbs infrared radiation 40 that has passed through the window member 11a of the package 11, a first insulating film 31 stacked on an upper surface (a surface upon which the infrared radiation is incident) of the absorption film 30, a second insulating film 32 stacked on a lower surface of the absorption film 30, and a reflective film 33 stacked on a lower surface of the second insulating film 32. The absorption structure 22 is formed as a result of the reflective film 33, the second insulating film 32, the absorption film 30, and the first insulating film 31 being stacked in this order in the production process.

The reflective film 33 plays a role as a reflector and has the light focusing effect of reflecting the infrared radiation 40 that has passed through the absorption film 30 and making the absorption film 30 absorb the infrared radiation 40.

As this reflective film 33, a component formed of a material that reflects the infrared radiation, such as a metal film of aluminum or titanium, can be used. There is no need to place a particular limitation on the reflective film 33, and, for example, the reflective film 33 is formed by performing deposition to obtain a desired film thickness by using a physical vapor deposition (PVD) apparatus. Here, it goes without saying that the desired film thickness means a film thickness with which the infrared radiation is sufficiently reflected.

Moreover, the absorption film 30, the first insulating film 31, and the second insulating film 32 are formed of a material having electrical insulating characteristics such as a nitride film, an oxide film, and a DLC film. However, it is assumed that a material that reflects the infrared radiation is not used.

Here, with consideration given to the energy loss caused by the structural members of the entire infrared solid-state imaging device 100, the first insulating film 31 and the second insulating film 32 are formed so as to have a film thickness with which the index of absorption of the infrared radiation 40 entering the absorption structure 22 is maximized.

That is, the infrared radiation radiated from the subject and the infrared radiation 40 entering the absorption structure 22 in the infrared solid-state imaging device 100 have different wavelengths. This is caused by the energy loss due to the passage of the infrared radiation through the window member 1a of the housing 1, the lens 2, and the window member 11a of the package 11. As a result, if the film thickness of each structural member of the absorption structure 22 is set such that the index of absorption is maximized in accordance with the wavelength of the infrared radiation radiated from the subject, it is not possible to achieve the maximum index of absorption because of the difference in characteristics from the infrared radiation 40 which is actual incident infrared radiation.

Thus, in the present invention, with consideration given to the above-described energy loss, the film thickness of the first insulating film 31 and the second insulating film 32 is set such that the index of absorption is maximized in accordance with the wavelength of the infrared radiation 40 that has passed through the window member 11a of the package 11 and reached the sensor element portion 10.

That is, if the refractive index of the first insulating film 31 and the second insulating film 32 is assumed to be n and the value of the transmission wavelength of the infrared radiation 40 is assumed to be λ, the total film thickness d of the first insulating film 31 and the second insulating film 32 is set at a film thickness that satisfies the relationship: the value of the transmission wavelength λ=4·n·d, the film thickness with which the incident light and the reflected light resonate with each other.

Here, the first insulating film 31 and the second insulating film 32 are formed so as to have the same film thickness and each have a thickness of d/2.

Next, the absorption film 30 will be described. The absorption film 30 is formed of nitride or oxide of a metal material. It is estimated that the index of absorption of this absorption film 30 is maximized when the sheet resistance becomes a free-space characteristic impedance of 377 Ω/sq.

Figure 8:
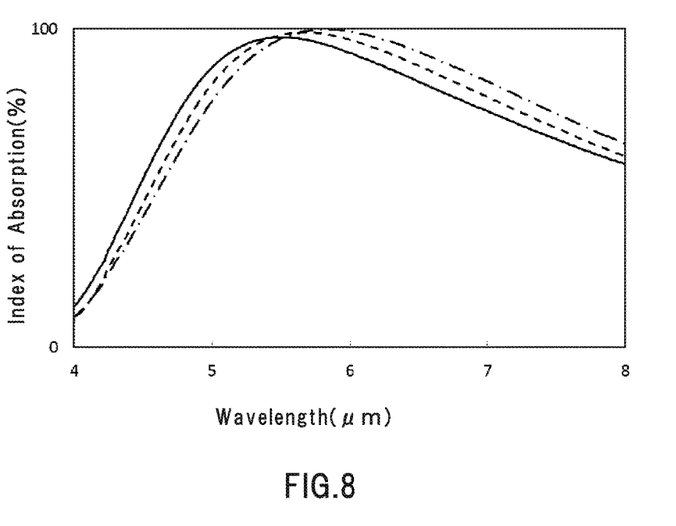
FIG. 8 is a diagram of the relationship between the film thickness of an absorption film forming the absorption structure of the first embodiment of the present invention and the spectral absorption characteristics.

Here, by using FIG. 8, the results of an experiment related to the spectral absorption characteristics observed when an oxide film of a metal material is deposited as the absorption film 30 by PVD and the film thickness of the material is changed will be described. FIG. 8 indicates the relationship between the film thickness of the absorption film forming the absorption structure 22 and the spectral absorption characteristics and indicates that, when the normalized film thickness is changed to 1.0, 1.1, and 1.25, the position which becomes an absorption index peak changes in a wavelength direction. In FIG. 8, a long and short dashed line indicates a case in which the film thickness of the absorption film 30 is a normalized film thickness of 1.0, a broken line indicates a case in which the film thickness of the absorption film 30 is a normalized film thickness of 1.1, and a solid line indicates a case in which the film thickness of the absorption film 30 is a normalized film thickness of 1.25.

As is clear from FIG. 8, by changing the film thickness of the absorption film 30, a shift in the peak of the waveform is observed and a movement of the peak of the index of absorption toward the short wavelength side associated with an increase in film thickness is observed. The reason is as follows. If the refractive index of the absorption film 30 is assumed to be n, since the optical length L=n·d (the film thickness of the absorption film 30) of the infrared radiation that has passed through this material has changed, the interference wavelength has changed and the resonant absorption wavelength in the absorption film 30 has shifted.

Thus, by optimizing the film thickness of the absorption film 30, as in the case of the first insulating film 31 and the second insulating film 32, it is possible to control the absorption wavelength with consideration given to the energy loss caused by the structural members of the entire infrared solid-state imaging device 100.

Here, an example of a specific film thickness of the first insulating film 31 and the second insulating film 32 of the absorption structure 22 will be described. If a nitride film with a refractive index n=2.1 is used as the first insulating film 31 and the second insulating film 32 and the transmission peak wavelength of the optical system is 10 μm, λ÷4÷n=10÷4÷2.1≈1.2 holds and the film thickness of the nitride film in resonant absorption by interference of light is 1.2 μm. The film thickness of this nitride film is the total film thickness of the first insulating film 31 and the second insulating film 32 and these films are formed so as to have the same film thickness.

As described above, as for the optimum film thickness when the wavelength of the infrared radiation 40 is 10 μm, the film thickness of the nitride film is set at 1.2 μm and the film thickness of the absorption film 30 is set at a film thickness that can take a sheet resistance value of 377 Ω/sq.

Therefore, in a typical configuration, the first insulating film 31 and the second insulating film 32 each have a film thickness of 0.6 μm and the absorption film 30 has a film thickness that takes a sheet resistance value of 377 Ω/sq.

In this way, the infrared solid-state imaging device 100 in which the absorption wavelength is optimally controlled is completed.

The feature of the infrared solid-state imaging device 100 in the first embodiment is that, with consideration given to the fact that the infrared radiation radiated from the subject is absorbed by the structural members (the window members 1a and 11a and the lens 2) of the infrared solid-state imaging device 100, the film thickness of each structural member is controlled such that the peak of the absorption wavelength of the absorption structure 22 is adjusted in accordance with the wavelength range in which the infrared spectral energy that is made to enter the absorption structure 22 of the sensor element portion 10 is the highest.

According to the present invention, even when an inexpensive material is used as an infrared transmitting member, by film thickness control of the first insulating film 31, the second insulating film 32, and so forth, it is possible to obtain the optimum absorption characteristics of the absorption film 30.

That is, according to the present invention, unlike the existing infrared solid-state imaging device provided with the infrared sensor designed on the premise that ideal spectral energy enters the infrared sensor, there is no need to use an expensive infrared transmitting member such as germanium, which makes it possible to keep the price of the device low.

Furthermore, even when the energy loss is produced in the optical transmission path to the sensor element portion 10, causing a shift in the peak of the transmission absorption waveform of the infrared radiation, it is possible to form the absorption structure 22 so as to have the optimum film thickness in accordance with the shifted peak and thereby obtain the optimum absorption characteristics.

Thus, by performing the design in such a way that the sensitivity of the entire system of the infrared solid-state imaging device 100 is maximized at all times, it is possible to perform optimum sensitivity tuning of the absorption structure 22 of the sensor element portion 10 of the infrared sensor 3.

As described above, according to the present invention, in the absorption structure 22 formed in the same plane, by setting the positions of absorption by interfering light and light absorption by natural vibration excitation by the material in accordance with the spectral transmission characteristics of the light passing through the window members 1a and 11a and the lens 2 which are component elements of the infrared solid-state imaging device 100, system performance optimization of the entire infrared solid-state imaging device 100 is achieved.

That is, even when, in a 3-to-15-μm wavelength range in consideration of the transmission in the atmosphere depicted in FIG. 2, an inexpensive material, such as silicon, in which material absorption occurs, not an expensive material such as germanium, is used as an optical material, it is easy to design the infrared sensor 3 having the absorption structure 22 optimized in accordance with the absorption wavelength of the spectral transmission characteristics.

Therefore, by performing the design of the infrared sensor 3 in accordance with the characteristics of the infrared radiation 40 that has passed through the window member 11a of the package 11 in the above-described manner, even when the optical member of the infrared solid-state imaging device 100 is formed of an inexpensive material such as silicon, it is possible to ensure the sensitivity of the infrared sensor 3 and achieve cost reduction of the entire system.

Second Embodiment

Figure 9:
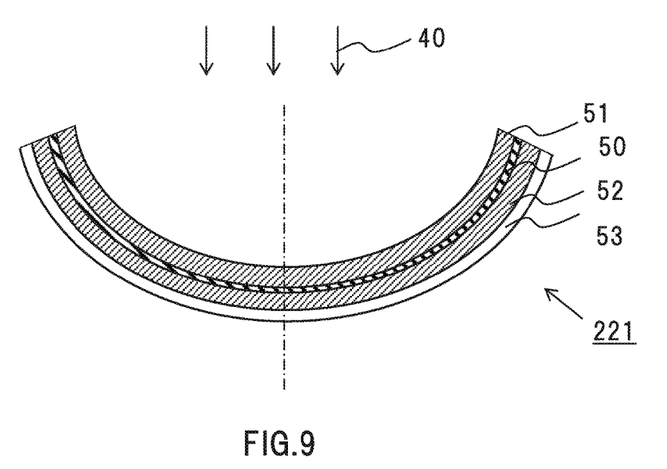
FIG. 9 is a sectional view of an absorption structure forming an infrared sensor of a second embodiment of the present invention.

Next, an infrared sensor 3 of a second embodiment of the present invention will be described by using FIG. 9. FIG. 9 is a sectional view of an absorption structure 221 forming the infrared sensor 3. In the above-described first embodiment, a case in which the absorption structure 22 has the shape of a flat plate is described as an example; in the second embodiment, a modified example thereof is depicted and, as depicted in FIG. 9, the absorption structure 221 has a curved shape, which is a concave shape in which the absorption structure 221 projects in a direction in which the absorption structure 221 gets closer to the upper surface of the substrate 20 supporting the absorption structure 221.

The absorption structure 221 of the second embodiment is a structure in which a second insulating film 52, an absorption film 50, and a first insulating film 51 are stacked in order on a reflective film 53. In FIG. 9, the entire absorption structure 221 is formed in a convex shape in which the absorption structure 221 projects toward the lower side of the plane of paper.

Here, the film thickness of each film is controlled in the same manner as in the above-described first embodiment.

Incidentally, as a method of forming this concave absorption structure 221, the absorption structure 221 can be obtained by, for example, forming a base having a concave surface portion, forming the reflective film 53, the second insulating film 52, the absorption film 50, and the first insulating film 51 on this base in this order, and then removing the base.

As described above, in the infrared sensor 3 having the concave absorption structure 221 of the second embodiment, the absorption structure 221 is formed so as to have a curved shape. As a result, when the infrared radiation 40 is incident in a direction perpendicular to a surface portion in the central position of the absorption structure 221, the optical lengths of the infrared radiation 40 in the absorption structure 221 are different in the central part and at both ends of the absorption structure 221. The optical length in the absorption structure 221 is short in the central part and becomes longer at ends.

Therefore, it is possible to make variable setting of the absorption wavelength of the infrared radiation 40 in the central part and at both ends of the absorption structure 221. In other words, it can be said that the half-width of the detection wavelength in the absorption wavelength design of the absorption structure 221 is increased.

As described above, by applying the infrared sensor 3 provided with the absorption structure 221 according to the second embodiment to the infrared solid-state imaging device 100, it is possible to obtain the effect similar to that of the first embodiment and also obtain the effect of the expansion of the half-width of the detection wavelength by forming the absorption structure 221 so as to have a concave shape, which makes it possible to perform optimum tuning with consideration given to the spectral absorption characteristics of each structural member.

Third Embodiment

Figure 10:
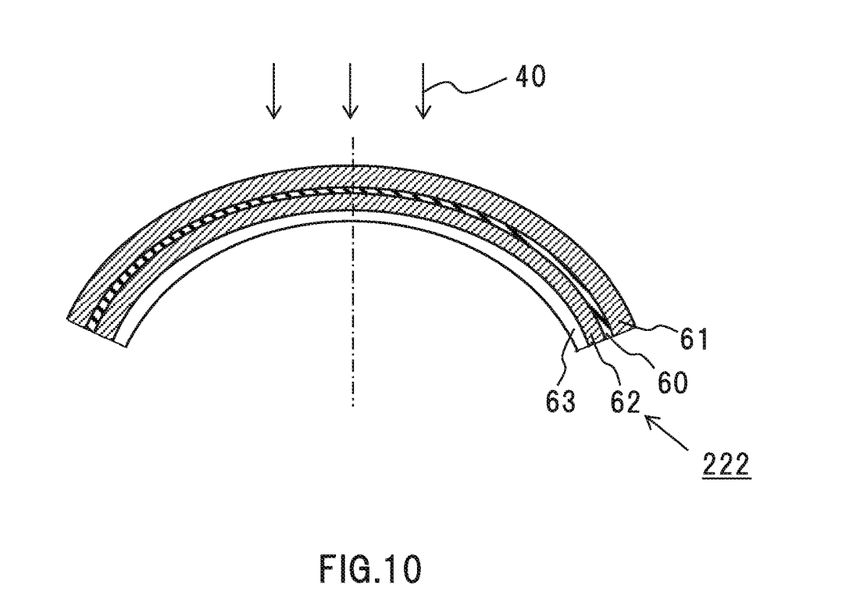
FIG. 10 is a sectional view of an absorption structure forming an infrared sensor of a third embodiment of the present invention.

Next, an infrared sensor 3 of a third embodiment of the present invention will be described by using FIG. 10. FIG. 10 is a sectional view of an absorption structure 222 forming the infrared sensor 3. In the above-described second embodiment, a case in which the absorption structure 221 has a concave shape is described as an example; this embodiment is a modified example thereof and, as depicted in FIG. 10, the absorption structure 222 of the third embodiment has a curved shape, which is a convex shape in which the absorption structure 222 projects in a direction in which the absorption structure 222 gets away from the upper surface of the substrate 20 supporting the absorption structure 222.

The absorption structure 222 of the third embodiment has a structure in which a second insulating film 62, an absorption film 60, and a first insulating film 61 are stacked in order on a reflective film 63. In FIG. 10, the entire absorption structure 222 is formed so as to be a curved surface in a convex shape in which the absorption structure 222 projects toward the upper side of the plane of the paper.

Here, the film thickness of each film is controlled in the same manner as in the above-described first embodiment.

Incidentally, as a method of forming this convex absorption structure 222, the absorption structure 222 can be obtained by, for example, forming a base having a convex surface portion, forming the reflective film 63, the second insulating film 62, the absorption film 60, and the first insulating film 61 on this base in this order, and then removing the base.

As described above, in the infrared sensor 3 having the convex absorption structure 222 of the third embodiment, since the absorption structure 222 is formed so as to have a curved shape, when the infrared radiation 40 is incident in a direction perpendicular to a surface portion in the central position of the absorption structure 222, the optical lengths of the infrared radiation 40 in the absorption structure 222 are different in the central part and at both ends of the absorption structure 222. The optical length in the absorption structure 222 is short in the central part and becomes longer at ends.

Therefore, also in this structure of the third embodiment, as is the case with the second embodiment, it is possible to make variable setting of the absorption wavelength of the infrared radiation 40 in the central part and at both ends of the absorption structure 222. In other words, it can be said that the half-width of the detection wavelength in the absorption wavelength design of the absorption structure 222 is increased.

As described above, by applying the infrared sensor 3 provided with the absorption structure 222 according to the third embodiment to the infrared solid-state imaging device 100, it is possible to obtain the effect similar to that of the first embodiment and also obtain the effect of the expansion of the half-width of the detection wavelength by forming the absorption structure 222 so as to have a convex shape, which makes it possible to perform optimum tuning with consideration given to the spectral absorption characteristics of each structural member.

Various modifications and alterations of this invention will be apparent to those skilled in the art without departing from the scope and spirit of this invention, and it should be understood that this is not limited to the illustrative embodiments set forth herein.

What is claimed is:

1. An infrared sensor comprising:
 a package; and
 an absorption structure that is disposed in the package, wherein said absorption structure includes an absorption film absorbing infrared radiation that has passed through a window member of the package, whereby a wavelength of radiation incident on said absorption structure is different from a wavelength of radiation incident on said window, a first insulating film stacked on an upper surface of the absorption film, a second insulating film stacked on a lower surface of the absorption film, and a reflective film stacked on a lower surface of the second insulating film, and is supported on a substrate, wherein the first insulating film and the second insulating film are formed so as to have a film thickness with which an index of absorption of the infrared radiation incident on the absorption structure is maximized, and if a refractive index of the first insulating film and the second insulating film is n and a transmission wavelength of the infrared radiation incident on the absorption structure is $\lambda$, the first insulating film and the second insulating film are formed such that a total film thickness d thereof satisfies a relationship: $\lambda=4 \cdot n \cdot d$.

2. The infrared sensor according to claim 1, wherein the first insulating film and the second insulating film are formed so as to have a same film thickness.

3. The infrared sensor according to claim 1, wherein the absorption structure has a shape of a substantially level plate and a substantially level surface of the absorption structure is disposed so as to be parallel to an upper surface of the substrate.

4. The infrared sensor according to claim 1, wherein the absorption structure including all of said films has a curved shape in which the absorption structure projects in a direction in which the absorption structure gets closer to the substrate.

5. The infrared sensor according to claim 1, wherein the absorption structure including all of said films has a curved shape in which the absorption structure projects in a direction in which the absorption structure gets away from the substrate.

* * * * *